(12) United States Patent
Keeth et al.

(10) Patent No.: US 6,438,016 B1
(45) Date of Patent: Aug. 20, 2002

(54) SEMICONDUCTOR MEMORY HAVING DUAL PORT CELL SUPPORTING HIDDEN REFRESH

(75) Inventors: Brent Keeth, Boise, ID (US); Charles Dennison, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/027,569

(22) Filed: Oct. 19, 2001

Related U.S. Application Data

(62) Division of application No. 09/650,546, filed on Aug. 30, 2000.

(51) Int. Cl.[7] ............................. G11C 5/06; G11C 11/24; H01L 27/108
(52) U.S. Cl. ................... 365/63; 365/149; 365/189.04; 257/296; 257/300; 257/907
(58) Field of Search ..................... 365/149, 63, 189.04, 365/230.05; 257/296, 300, 301, 306, 906, 907

(56) References Cited

U.S. PATENT DOCUMENTS

| | | | |
|---|---|---|---|
| 4,780,849 A | 10/1988 | Nakagawa et al. | .... 365/189.03 |
| 5,856,940 A | 1/1999 | Rao | ............................ 365/149 |
| 5,923,593 A | 7/1999 | Hsu et al. | .............. 365/189.04 |
| 6,025,221 A * | 2/2000 | Brown | ........................ 438/238 |
| 6,097,621 A * | 8/2000 | Mori | ............................ 365/63 |
| 6,233,193 B1 | 5/2001 | Holland et al. | ............. 365/222 |

* cited by examiner

Primary Examiner—Son Mai
(74) Attorney, Agent, or Firm—Williams, Morgan & Amerson, P.C.

(57) ABSTRACT

The present invention is directed to an integrated circuit device having a memory cell for storing a data and refresh circuitry for refreshing that data in the memory cell. In one illustrative embodiment, the device comprises a memory cell having a storage element, a read/write access device, and a refresh access device. A read/write digit line is coupled to the read/write access device, and a refresh digit line is coupled to the refresh access device. A sense amplifier is coupled to the read/write digit line, and input/output circuitry is coupled to the read/write digit line. A refresh sense amplifier is coupled to the refresh digit line. The memory cell is constructed in such a way as to provide a large charge storage capacity in a relatively small, compact area.

10 Claims, 3 Drawing Sheets

SEMICONDUCTOR MEMORY HAVING DUAL PORT CELL SUPPORTING HIDDEN REFRESH

This is a divisional of co-pending application Ser. No. 09/650,546, filed Aug. 30, 2000.

BACKGROUND OF THE INVENTION

1. Field of the Invention

The present invention relates generally to semiconductor memories, and, more particularly, to a dynamic random access memory (DRAM) employing a dual port memory cell that supports hidden refresh.

2. Description of the Related Art

Semiconductor memory devices have been well-known for many years. Such devices are typically one of two types: volatile memory devices, such as dynamic random access memories (DRAMs), and non-volatile memory devices, such as static random access memories (SRAMs). Non-volatile memory devices will normally store data for an indefinite period of time once the data has been written into the memory cells. The cells are designed such that the electrical charge placed in the cell will remain in the cell indefinitely under appropriate conditions. The indefinite storage of the electrical charge is an advantage of the non-volatile memories, however, the memory cell in such a device is generally fairly large as compared to the memory cell in a volatile memory, and the larger memory cells consume a larger space on the semiconductor die.

Volatile memory devices will store electrical charge only for a very short period of time, and the electrical charge in the cells must be periodically refreshed. This requirement of refreshing the electrical charge in each of the memory cells is a disadvantage of volatile memories, but the memory cell size in these devices is typically much smaller than the cell size in the non-volatile memories. This difference is cell sizes allows the placement of a much larger number of volatile memory cells within a given die space as compared to the number of non-volatile memory cells that can be placed within the same die space. In modern microcomputer applications, a large amount of random access memory is typically required or, at least, desired. Moreover, because of the desire for ever increasing data processing speeds, greater amounts of random access memory have been incorporated within the same die with logic circuitry. For example, modern microprocessors typically include a large amount of on-chip memory to serve as a cache. As the amount of memory in an array increases, the amount of time required to refresh all the memory cells in the array likewise increases, "stealing" time that might otherwise be used for "read" and "write" operations.

Efforts have been made to develop a system that would allow DRAM devices to replace SRAM devices in various cache architectures. A primary goal in those efforts has been to support greater amounts of cache memory in a system while simultaneously reducing costs. Two requirements in such a system are that the DRAM cache handle its own refresh requirements and that the refresh operations be completely hidden, i.e., that the refresh operations are transparent to the user. Prior attempts to design cache parts with DRAM devices have never completely solved the hidden refresh problem. These attempts have included utilizing on-board SRAM to store either a single row of DRAM data or multiple rows of DRAM data such that whenever this data is addressed, the corresponding row or rows are freed to be refreshed. Most of these attempts have constrained the system in various ways and are not seen as supporting truly random access.

The present invention eliminates or, at least, reduces the aforementioned problems.

SUMMARY OF THE INVENTION

The present invention is directed to an integrated circuit device having a memory cell for storing a data and refresh circuitry for refreshing that data in the memory cell. In one illustrative embodiment, the device comprises a memory cell having a storage element, a read/write access device, and a refresh access device. A read/write digit line is coupled to the read/write access device, and a refresh digit line is coupled to the refresh access device. A sense amplifier is coupled to the read/write digit line, and input/output circuitry is coupled to the read/write digit line. A refresh sense amplifier is coupled to the refresh digit line. The invention may be implemented in an integrated circuit memory device, or it may be combined with other semiconductor devices, either on a single semiconductor chip, within a single integrated circuit package, or in separate integrated circuit packages interconnected by means of other electrical circuitry.

In another aspect of the invention, a method of operating an integrated circuit device comprises coupling a memory cell to a first digit line, writing a data into the memory cell through the first digit line, de-coupling the memory cell from the first digit line, coupling the memory cell to a second digit line, refreshing the data in the memory cell through the second digit line, de-coupling the memory cell from the second digit line, coupling the memory cell to the first digit line, reading the data in the memory cell through the first digit line, de-coupling the memory cell from the first digit line, and periodically coupling the memory cell to the second digit line, refreshing the data in the memory cell through the second digit line, and de-coupling the memory cell from the second digit line.

In yet another aspect of the invention a semiconductor memory cell comprises a charge storage element, a first access transistor coupled to the charge storage element and adapted to couple the charge storage element to a read/write digit line, and a second access transistor coupled to the charge storage element and adapted to couple the charge storage element to a refresh digit line. The first access transistor has a gate terminal coupled to a read/write word line, and the second access transistor has a gate terminal coupled to a refresh word line.

In yet another aspect of the invention, a semiconductor memory cell comprises a substrate and a serpentine active area in the substrate. First and second parallel digit lines overlap first and second regions, respectively, of the serpentine active area. First and second parallel word lines extend substantially orthogonally to the first and second parallel digit lines and overlap third and fourth regions, respectively, of the serpentine active area. A generally rectangular capacitor structure is parallel to and overlaying a fifth region of the serpentine active area between the first and second word lines.

BRIEF DESCRIPTION OF THE DRAWINGS

Further features and advantages of the present invention will become apparent from the following description of a preferred embodiment of the invention, as illustrated in the accompanying drawings in which like reference numerals generally refer to the same parts, elements or functions throughout the figures, and in which.

Figure 1:
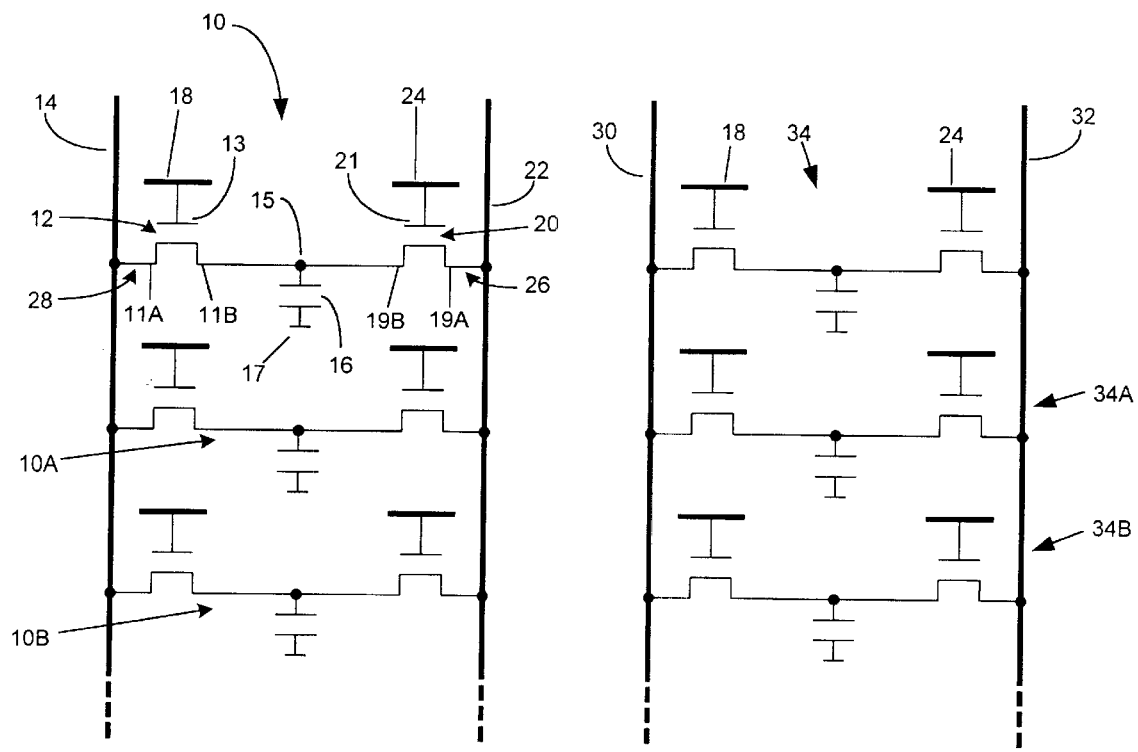
FIG. 1 is a schematic illustration of dynamic random access memory cells employed in one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The embodiment described herein represents a new DRAM architecture that supports hidden refresh operations for cache memory applications. The DRAM cell utilized in the described embodiment is a dual port DRAM comprising one capacitor and two access transistors. The DRAM cell is constructed in such a way that the capacitor is common to the two access transistors. Each access transistor is coupled between the capacitor and a unique digit line, allowing independent access to the capacitor by the two digit lines. The architecture described herein allows the use of the second port for refresh operations. Normal read or write operations are not permitted by way of the second port of the memory cell. Instead, read and write operations are conducted via the first port of the memory cell. As a result, the refresh sense amplifier used by the second port requires no I/O devices. This reduces the overall area penalty by minimizing the pitch cell overhead associated with the second port.

FIG. 1 illustrates a group of dynamic random access memory cells employed in one embodiment of the present invention. It is to be understood at the outset that, in practice, a DRAM array would include many similar cells arranged in rows and columns for accessing selected cells during read and write operations. In addition, a memory array embodying a number of such cells would include conventional address decode circuits, clocking circuits, sense amplifier circuits, data and address buffers, and a number of other circuits (all not shown) which would be required to support memory operations. Further, the present invention may be advantageously embodied as on-chip memory, for example, with a micro-computer, or integrated into a memory chip by itself. When integrated with other circuitry, e.g., logic circuitry, processor circuitry and the like, into a single integrated circuit die or within a single integrated circuit package, for example, a DRAM or other memory array may employ the present invention to great advantage by coupling input/output circuitry between the memory array and the on-chip or in-package logic or processor circuitry. As a result, the DRAM or other memory array may provide cache memory for use by the logic or processor circuitry.

Figure 2:
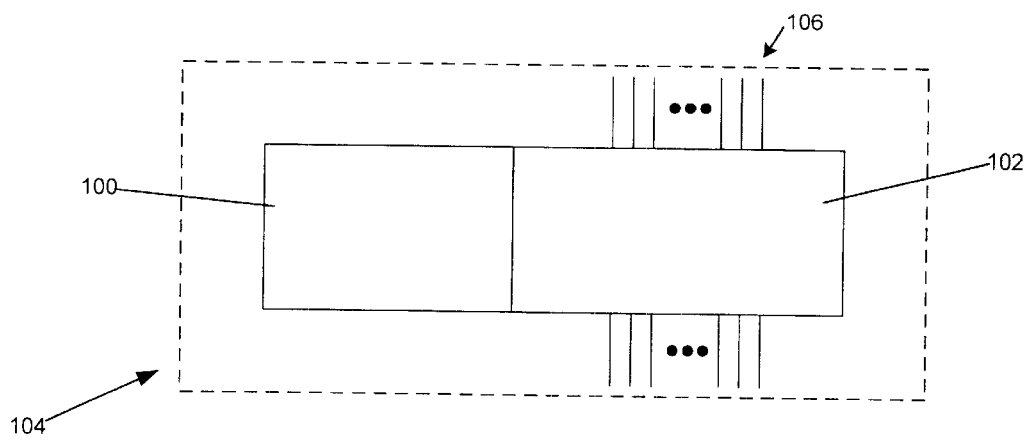
FIG. 2 illustrates one embodiment of the present invention incorporated with other integrated circuitry on a single semiconductor chip.

FIG. 2 illustrates an arrangement in which a memory device 100 using the present invention is integrated with processor circuitry 102 into a single semiconductor chip 104. The chip 104 includes leads 106 for coupling signals into and out of the chip 104. Alternatively, the memory device 100 may be implemented in a semiconductor chip separate from the processor circuitry 102, and the two separate chips may be packaged together in a single integrated circuit package 104. Again, leads 106 would provide for coupling signals into and out of the package. A variety of other combinations may also be made.

Figure 3:
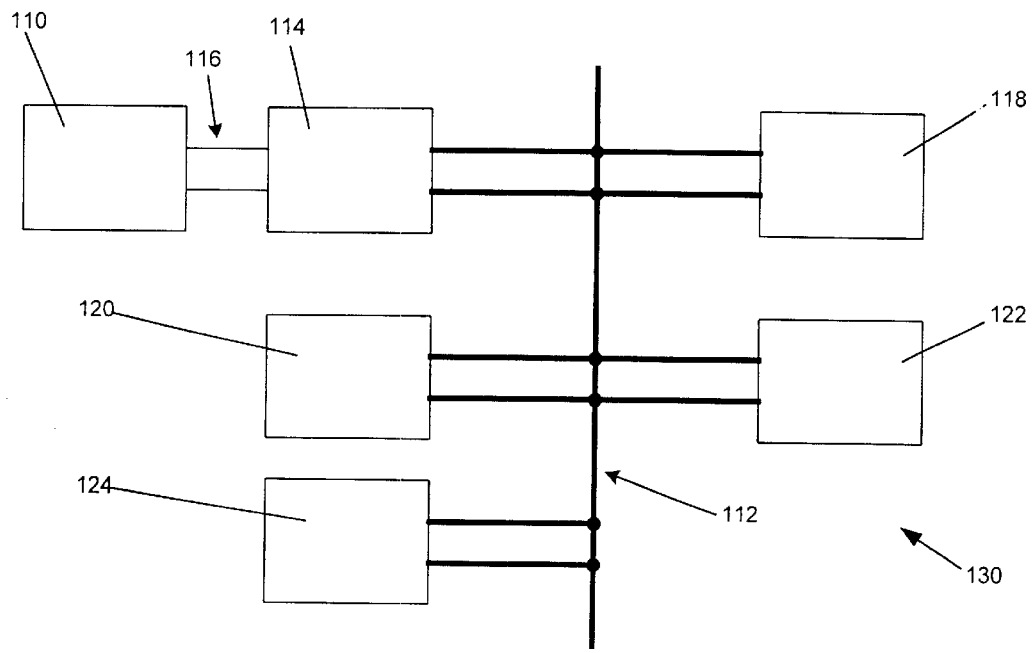
FIG. 3 illustrates a computer system in which a DRAM device employing the present invention is used.

Likewise, with reference to FIG. 3, the present invention may be realized in a memory device 110 that is designed for interconnection with other integrated circuit devices by way of a bus or buses 112. For example, a DRAM device 110 may employ the present invention and be combined with a memory controller 114 by way of interconnections 116, an interconnecting bus 112, a processor 118, and possibly other memory devices 120, logic devices 122, and peripheral devices 124 to form a computer system 130. Combinations of various components in this fashion are well known, and a general illustration of such is shown in FIG. 3.

Returning to FIG. 1, the memory cell 10 utilized in one embodiment of the present invention includes a read/write field-effect transistor 12 having a source 11A and drain 11B connected in series between a read/write digit line 14 and a storage node 15 of a storage capacitor 16. The storage capacitor 16 is connected between node 15 and a reference voltage 17 of Vcc/2. The read/write transistor 12 also has a gate 13 which may be driven into conduction by a signal carried by a row address word line 18 connected to the gate 13. The cell 10 also includes a refresh field-effect transistor 20 having a source 19A and drain 19B connected in series between a refresh digit line 22 and the storage node 15 at capacitor 16. The refresh transistor 20 also has a gate 21 which may be driven into conduction by a signal carried by a refresh word line 24 connected to the gate 21.

In a preferred form of the invention, the read/write and refresh transistors 12 and 20, respectively, form access circuits and are N-channel MOS devices constructed to exhibit enhancement mode characteristics. Of course, those skilled in the art, having benefit of the present disclosure, may prefer to construct a memory array utilizing a different type of transistor. Also, the storage capacitor 16 is preferably of the semiconductor type which exhibits a high capacitance per unit of wafer area. However, the storage capacitor 16 may be constructed using any suitable technology, and the structure need not be a capacitor.

The operation of the two-transistor, one-capacitor DRAM cell 10 is described briefly as follows. In response to a read or write operation of the cell 10, an address to the memory array is decoded such that a row address signal on the row address word line 18 is driven to a high logic level, wherein the read/write transistor 12 is driven into conduction. The refresh word line 24 remains at a logic low level, thereby maintaining the refresh transistor 20 in a non-conducting state. With the read/write transistor 12 in a conducting state, the capacitor 16 is coupled to the read/write digit line 14, and a data will be read from or written to the memory cell 10. A sense amplifier and other appropriate circuitry will be coupled to the read/write digit line 14 to accomplish the appropriate read or write operation. At the completion of the read or write operation, the row address word line 18 will resume a low logic level, and the read/write transistor 12 will be turned off, again isolating the capacitor 16 of the memory cell 10 from the read/write digit line 14. As is generally illustrated in FIG. 1, it is to be understood that a number of memory cells 10, 10A, 10B, etc. will be connected between the read/write digit line 14 and the refresh digit line 22 to form a column of cells in the memory array. Similarly, a number of memory cells 34, 34A, 34B, etc. will be coupled between a read/write digit line 30 and a refresh digit line 32 to form another column of cells in the memory array. As is illustrated in FIG. 1, a memory cell 10 coupled between the read/write digit line 14 and the refresh digit line 22 will share a read/write word line 18 and a refresh word line 24 with a memory cell 34 that is coupled between the read/write digit line 30 and the refresh digit line 32. This arrangement of memory cells in sharing digit lines and word lines and forming an array is well-understood by those of ordinary skill in the art.

In accordance with one aspect of the invention, the memory cell 10 is characterized as having a refresh port 26 dedicated to refreshing a data in the cell 10. The refresh port 26, which is accessed by way of the refresh transistor 20 shown in FIG. 1, provides for communication between the memory cell 10 and the refresh digit line 22. Coupled to the refresh line 22 is a refresh sense amplifier 40 (see FIG. 4). The memory cell 10 also has a read/write port 28 that is accessed when a data in the cell 10 is to be read or written. The read/write port 28 is accessed by way of the read/write transistor 12 to provide communication between the memory cell 10 and the read/write digit line 14. Coupled to the read/write digit line 14 will be sense amplifiers (not shown) for reading the cell 10 as well as input/output circuitry (not shown) that enables data to be transferred between the memory cell 10 and a source or destination outside the array. Sense amplifiers and input/output circuitry for these purposes are known in the art, and a person of ordinary skill in the art, with benefit of the present disclosure, will easily be enabled to implement suitable circuitry for such purposes when constructing an embodiment employing the present invention.

Figure 4:
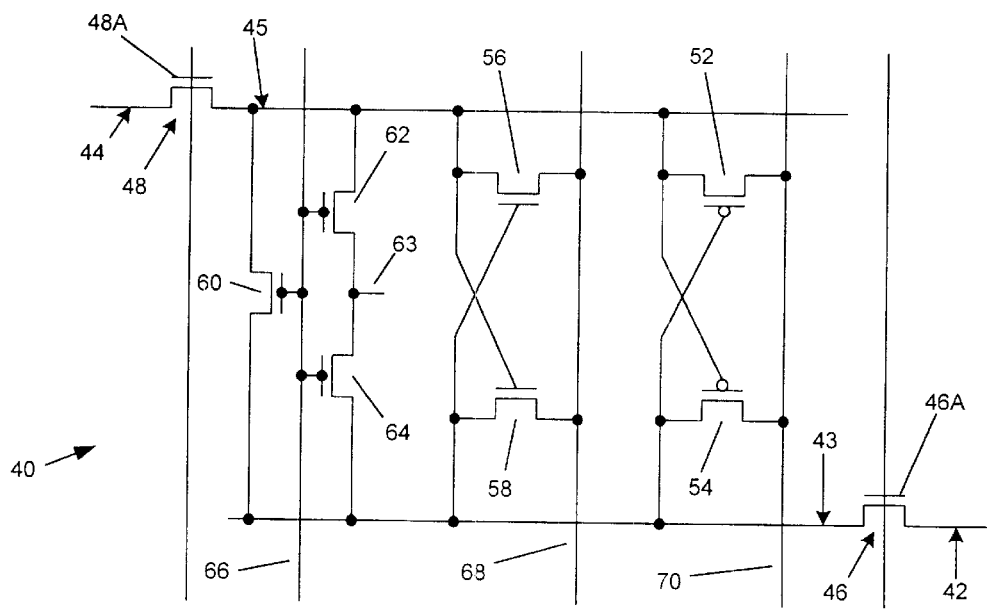
FIG. 4 illustrates a portion of one embodiment of the present invention in which an open digit line array architecture is employed.

Referring to FIG. 4, a node 43 of a refresh sense amplifier 40 is coupled to a first refresh digit line 42 by way of an isolation transistor 46. A node 45 of the refresh sense amplifier 40 is coupled to a second refresh digit line 44 by way of an isolation transistor 48. The isolation transistors 46, 48 in the embodiment illustrated in FIG. 4 are maintained in an "on" state by application of an appropriate potential at the gates 46A, 48A of the isolation transistors 46 and 48. The isolation transistors 46 and 48 serve to stabilize the operation of the refresh sense amplifier 40.

The refresh sense amplifier 40 includes two n-type transistors 56 and 58 that are cross-coupled between the nodes 43 and 45 of the refresh sense amplifier 40. A first signal line 68 is coupled to the drains of the cross-coupled n-type transistors 56 and 58. The refresh sense amplifier 40 also includes two p-type transistors 52 and 54 that are also cross-coupled between the nodes 43 and 45 of the sense amplifier 40. A second signal line 70 is coupled to the sources of the two cross-coupled p-type transistors 52 and 54. An equalizing transistor 60 is coupled between the nodes 43 and 45 of the refresh sense amplifier 40, and two bias transistors 62 and 64 are connected in series and coupled between the nodes 43 and 45 of the refresh sense amplifier. An equalizing signal line 66 is coupled to the gates of the equalizing transistor 60 and the bias transistors 62 and 64. A common node between the bias transistors 62 and 64 is coupled to a power supply node 63. Other arrangements and forms of refresh sense amplifiers may alternatively be utilized in implementing the present invention.

The operation of the refresh sense amplifier 40 illustrated in FIG. 4 is as follows. Before a memory cell 10 (not shown in FIG. 4) is coupled to either the first refresh digit line 42 or to the second refresh digit line 44, a potential is applied to the equalizing signal line 66. In one embodiment of the present invention, the magnitude of the potential applied at the line 66 is approximately 2.5 volts, which is a full Vcc potential. The application of the potential at the equalizing signal line 66, by operation of the equalizing transistor 60 and the bias transistors 62 and 64, equalizes the voltage potentials on the nodes 43 and 45 of the refresh sense amplifier 40. When the voltages on the nodes 43 and 45 of the refresh sense amplifier 40 have been equalized, the signal on the line 66 is driven to ground, and the equalizing transistor 60 and the bias transistors 62 and 64 turn off. At that time, the memory cell 10 (not shown in FIG. 4) will be coupled, by way of its access transistor 20 (see FIG. 1), to the first refresh digit line 42. No memory cell will be coupled to the second refresh digit line 44 in this example. (Alternatively, a memory cell 10 will be coupled to the second refresh digit line 44, while no memory cell will be coupled to the first refresh digit line 42.) The charge present in (or absent from) the memory cell 10, when coupled to the first refresh digit line 42 will upset the balance between the nodes 43 and 45 of the refresh sense amplifier 40. A voltage potential will then be applied to the first signal line 68 and, through the action of the cross-coupled n-type transistors 56 and 58, the voltage difference between the nodes 43 and 45 will begin to increase. The signal on the line 68 will then be driven to ground before the signal on the second signal line 70 will be taken from ground to a full Vcc potential of approximately 2.5 volts. Application of this potential to the line 70, through the action of the cross-coupled p-type transistors 52 and 54, will further amplify the voltage difference between the nodes 43 and 45 of the refresh sense amplifier 40. At that time, the refresh transistor 20 (see FIG. 1) of the memory cell 10 will be turned off, "capturing" a full charge in the capacitor 16 of the memory cell 10, thus refreshing the memory cell 10.

The arrangement of the refresh digit lines and refresh sense amplifier illustrated in FIG. 4 is an open digit line array architecture. An open digit line array architecture is one in which two digit line halves coupled to a differential sense amplifier during sensing are not routed parallel and adjacent one another in the array. Rather, the two digit line halves span different portions of the array. This arrangement is well known to those of ordinary skill in the art, as many memory devices (e.g., many DRAM devices) have utilized this general arrangement in the past.

Figure 5:
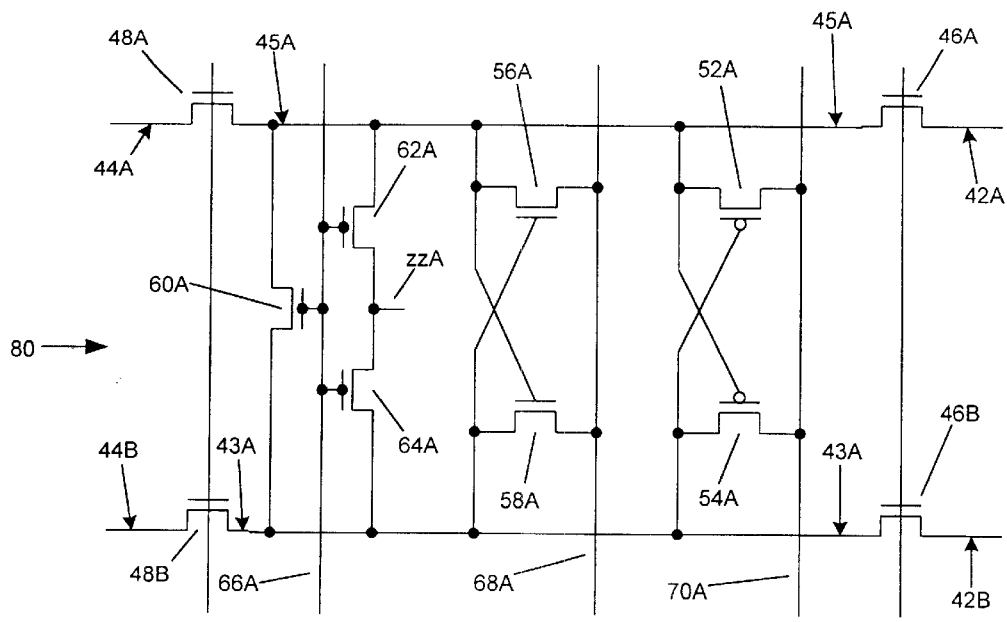
FIG. 5 illustrates a portion of another embodiment of the present invention in which a folded bit line architecture is employed.

Referring now to FIG. 5, another embodiment of the present invention is illustrated in which a folded digit line array architecture is utilized. A folded digit line array architecture is one in which two digit line halves are arranged in parallel and adjacent (or nearly so) one another, and the two digit line halves are coupled to a sense amplifier (e.g., a differential source amplifier) during sensing. This arrangement, sometimes known as a folded bitline architecture, reduced common mode noise effects in sensing. The operation of the refresh sense amplifier 80 in FIG. 5 is the same as the operation of the refresh sense amplifier 40 in FIG. 4. In the embodiment illustrated in FIG. 5, a pair of refresh digit lines 42A and 42B may be coupled to nodes 45A and 43A, respectively, of the refresh sense amplifier 80 by way of isolation transistors 46A and 46B, respectively. A second pair of refresh digit lines 44A and 44B may be coupled to nodes 45A and 43A, respectively, of the refresh sense amplifier 80 by way of isolation transistors 48A and 48B, respectively. In the embodiment illustrated in FIG. 5, when a refresh operation is performed, either the pair of refresh digit lines 42A and 42B will be coupled to the refresh sense amplifier 80 or the pair of refresh digit lines 44A and 44B will be coupled to the refresh sense amplifier 80. In general, both pairs of refresh igit lines will not be coupled to the refresh sense amplifier 80 at the same time.

Figure 6:
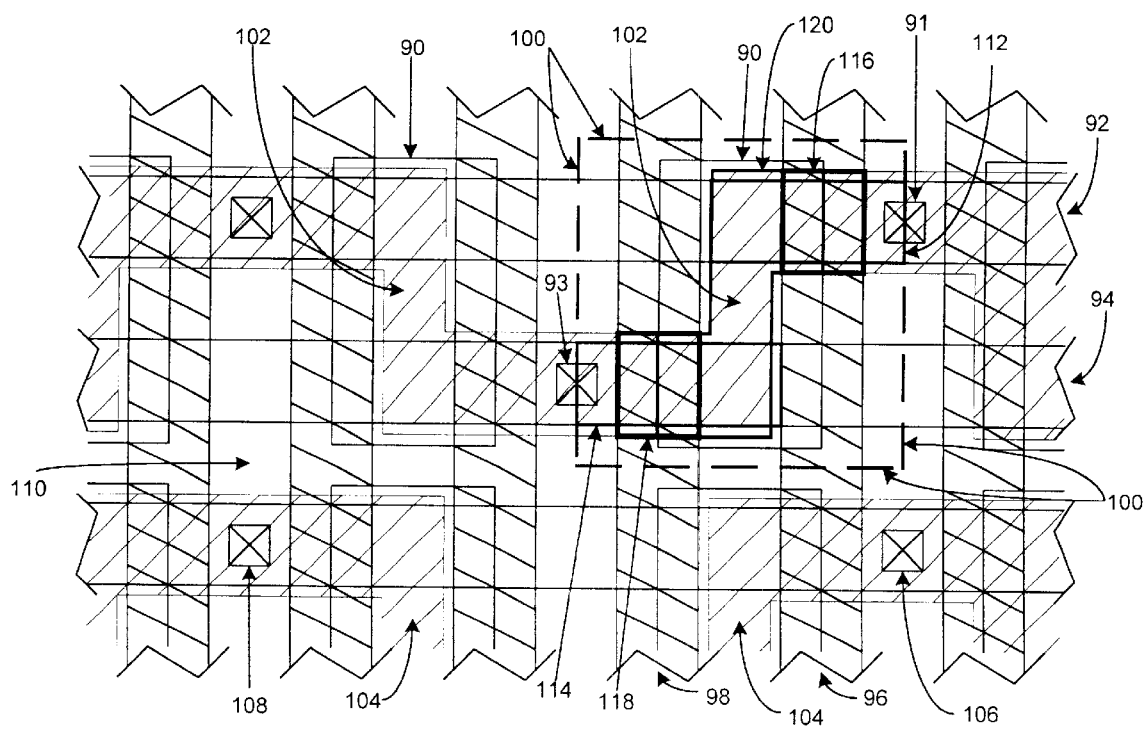
FIG. 6 illustrates a portion of one illustrative chip layout in which dual port DRAM cells are employed.

Referring now to FIG. 6, a layout of a dual port DRAM cell useful in the present invention is illustrated. The capacitor 90 is the storage element portion of the memory cell, and that storage element may be coupled to a read/write digit line 92 or to a refresh digit line 94 at nodes 91 and 93, respectively. The specific structure of the capacitor 90 may take a number of acceptable forms, including, for example, a stack structure, a comb structure, or other standard capacitor structure. A "capacitor over bitline" technology or a "bitline over capacitor" technology may be employed. A read/write word line 96, when activated, will coupled the memory cell 90 to the read/write digit line 92, whereas a refresh word line 98, when activated, will couple the memory cell 90 to the refresh digit line 94.

As can be seen, in the embodiment illustrated in FIG. 6, the memory cell requires a space of approximately four feature sizes by four feature sizes, resulting in a sixteen square feature size memory cell. The memory cell is contained within the four dashed lines 100 in FIG. 6. In this context, a "feature size" is approximately the width of a word line or digit line, for example, or the width of the spacing between two adjacent word lines or two adjacent digit lines. As is readily apparent from FIG. 6, the capacitor 90 is constructed and situated between adjacent word lines, e.g., word lines 96, 98. In the illustrative embodiment of FIG. 6, N+ active areas 102, 104 wind serpentine-like through the array. For example, the N+ active area 102 intersects the contacts 91 and 93, and the N+ active area 104 intersects the contacts 106 and 108. The access transistors (e.g., transistors 12, 20 in FIG. 1) are located at those points where the word lines (e.g., word lines 96, 98) overlap the N+ active areas (e.g., N+ active areas 102, 104). This arrangement of a serpentine active area 102, alternating read/write and refresh digit lines 92, 94, and alternating read/write and refresh word lines 96, 98, allows the construction of a relatively large memory cell with relatively large capacitive value. Due to the relatively large cell area and corresponding large capacitive value, a significant charge can be transferred to the refresh digit lines during refresh operation, helping to overcome noise that may be associated with an open digit line array architecture.

In one illustrative embodiment of the present invention, a semiconductor memory cell comprises a charge storage element 16, a first access transistor 12 coupled to the charge storage element 16 and adapted to couple the charge storage element 16 to a read/write digit line 14. A second access transistor 20 is coupled to the charge storage element 16 and is adapted to couple the charge storage element 16 to a refresh digit line 22. The first access transistor 12 has a gate terminal 13 coupled to a read/write word line 18, and the second access transistor 20 has a gate terminal 21 coupled to a refresh word line 24.

In another illustrative embodiment of the present invention, a semiconductor memory cell comprises a substrate 110, and a serpentine active area 102 in the substrate 110. A first digit line 92 is parallel to a second digit line 94, and the first and second parallel digit lines 92, 94 overlap first and second regions 112, 114, respectively, of the serpentine active area 102. A first word line 96 is parallel to a second word line 98, and the first and second parallel word lines 96, 98 extend substantially orthogonally to the first and second digit lines 92, 94. Moreover, the first and second parallel word lines 96, 98 overlap third and fourth regions 116, 118, respectively, of the serpentine active area 102. A generally rectangular capacitor structure 90 is parallel to and overlaying a fifth region 120 of the serpentine active area 102 between the first and second word lines 96, 98. A first contact 91 extends between the first digit line 92 and the first region 112 of the serpentine active area 102. A second contact 93 extends between the second digit line 94 and the second region 114 of the serpentine active area 102. As previously mentioned, the capacitor structure 90 may be situated over the first and second digit lines 92, 94, or the first and second digit lines 92, 94 may be situated over the capacitor structure 90. As also previously mentioned, the capacitor structure 90 may comprise a stack structure, a comb structure or any other suitable capacitor structure. The serpentine active area 102, in the illustrated embodiment, comprises an N+ serpentine active area.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor memory cell, comprising:

a substrate;

a serpentine active area in the substrate;

first and second parallel digit lines overlapping first and second regions, respectively, of the serpentine active area;

first and second parallel word lines extending substantially orthogonally to the first and second parallel digit lines and overlapping third and fourth regions, respectively, of the serpentine active area; and a generally rectangular capacitor structure parallel to and overlaying a fifth region of the serpentine active area between the first and second word lines.

2. The semiconductor memory cell of claim 1, wherein the capacitor structure is situated over the first and second digit lines.

3. The semiconductor memory cell of claim 1, wherein the first and second digit lines are situated over the capacitor structure.

4. The semiconductor memory cell of claim 1, wherein the capacitor structure comprises a stack structure.

5. The semiconductor memory cell of claim 1, wherein the capacitor structure comprises a comb structure.

6. The semiconductor memory cell of claim 1, wherein the serpentine active area comprises an N+ serpentine active area.

7. The semiconductor memory cell of claim 1, wherein the capacitor structure partially overlaps the first and second word lines and extends beyond the first and second digit lines.

8. The semiconductor memory cell of claim 1, further comprising:
   a first access transistor comprising an area of overlap between the first word line and the third region of the serpentine active area; and
   a second access transistor comprising an area of overlap between the second word line and the fourth region of the serpentine active area.

9. The semiconductor memory cell of claim 1, further comprising:
   a first contact extending between the first digit line and the first region of the serpentine active area; and
   a second contact extending between the second digit line and the second region of the serpentine active area.

10. The semiconductor memory cell of claim 1, wherein the memory cell is approximately four feature sizes in width and approximately four feature sizes in length.

* * * * *